United States Patent
Tang

(10) Patent No.: US 10,638,837 B2
(45) Date of Patent: May 5, 2020

(54) SLIDING MECHANISM AND MOUNTING APPARATUS USING THE SAME

(71) Applicant: HONGFUJIN PRECISION ELECTRONICS (TIANJIN) CO., LTD., Tianjin (CN)

(72) Inventor: Chen-Sheng Tang, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/014,175

(22) Filed: Jun. 21, 2018

(65) Prior Publication Data

US 2019/0313794 A1    Oct. 17, 2019

(30) Foreign Application Priority Data

Apr. 16, 2018   (CN) .......................... 2018 1 0337314

(51) Int. Cl.
 *A47B 88/44*    (2017.01)
 *A47B 88/443*   (2017.01)

(52) U.S. Cl.
 CPC ............ *A47B 88/443* (2017.01); *A47B 88/44* (2017.01); *A47B 2210/007* (2013.01); *A47B 2210/0064* (2013.01)

(58) Field of Classification Search
 CPC ....... A47B 88/40; A47B 88/44; A47B 88/443; A47B 88/473; A47B 88/477; A47B 2210/0016; A47B 2210/0018; A47B 2210/0021; A47B 2210/0064; A47B 2210/0067; A47B 2210/007; A47B 2210/0081
 See application file for complete search history.

(56) References Cited

U.S. PATENT DOCUMENTS

| | | | | |
|---|---|---|---|---|
| 7,404,611 | B1 * | 7/2008 | Que ..................... | A47B 88/493 312/333 |
| 7,654,624 | B2 * | 2/2010 | Huang .................. | A47B 88/49 312/333 |
| 7,712,851 | B2 * | 5/2010 | Huang ................. | A47B 88/493 312/333 |
| 7,726,755 | B2 * | 6/2010 | Peng ...................... | A47B 88/57 312/334.46 |
| 7,740,328 | B2 * | 6/2010 | Huang ................. | A47B 88/443 312/333 |
| 7,980,641 | B2 * | 7/2011 | Huang .................. | A47B 88/49 312/333 |
| 8,007,060 | B2 * | 8/2011 | Duan ................... | H05K 7/1489 312/333 |

(Continued)

*Primary Examiner* — Andrew M Roersma
(74) *Attorney, Agent, or Firm* — ScienBiziP, P.C.

(57) ABSTRACT

A mounting apparatus using a sliding mechanism for easy insertion and removal of insertable units includes a supporting bracket and a sliding mechanism. The sliding mechanism includes an outer rail, a middle rail, an inner rail, a latching unit, and a locking unit. The latching unit includes first and second guiding portions on the inner rail, first and second positioning members slidably mounted to the middle rail, and third and second guiding portions on the outer rail. The locking unit includes a locking member at end of the inner rail and a locking portion on the middle rail to correspond to the locking member.

20 Claims, 7 Drawing Sheets

(56) References Cited

U.S. PATENT DOCUMENTS

| | | | | |
|---|---|---|---|---|
| 8,371,542 B2 * | 2/2013 | Zhang | ................. | H05K 7/1489 |
| | | | | 248/220.21 |
| 8,393,692 B2 * | 3/2013 | Yu | ........................ | H05K 7/1489 |
| | | | | 312/333 |
| 2011/0262060 A1 * | 10/2011 | Yu | ........................ | H05K 7/1489 |
| | | | | 384/21 |

* cited by examiner

SLIDING MECHANISM AND MOUNTING APPARATUS USING THE SAME

FIELD

The subject matter herein generally relates to sliding mechanisms.

BACKGROUND

A typical sliding mechanism of a server generally includes an inner rail, a middle rail, and an outer rail. The inner rail is mounted on the server, the outer rail is mounted to a support frame of the server, and the middle rail is mounted between the inner rail and the outer rail to extend the sliding distance of the sliding mechanism. Conventional sliding mechanisms can be complicated and take up a lot of space. Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
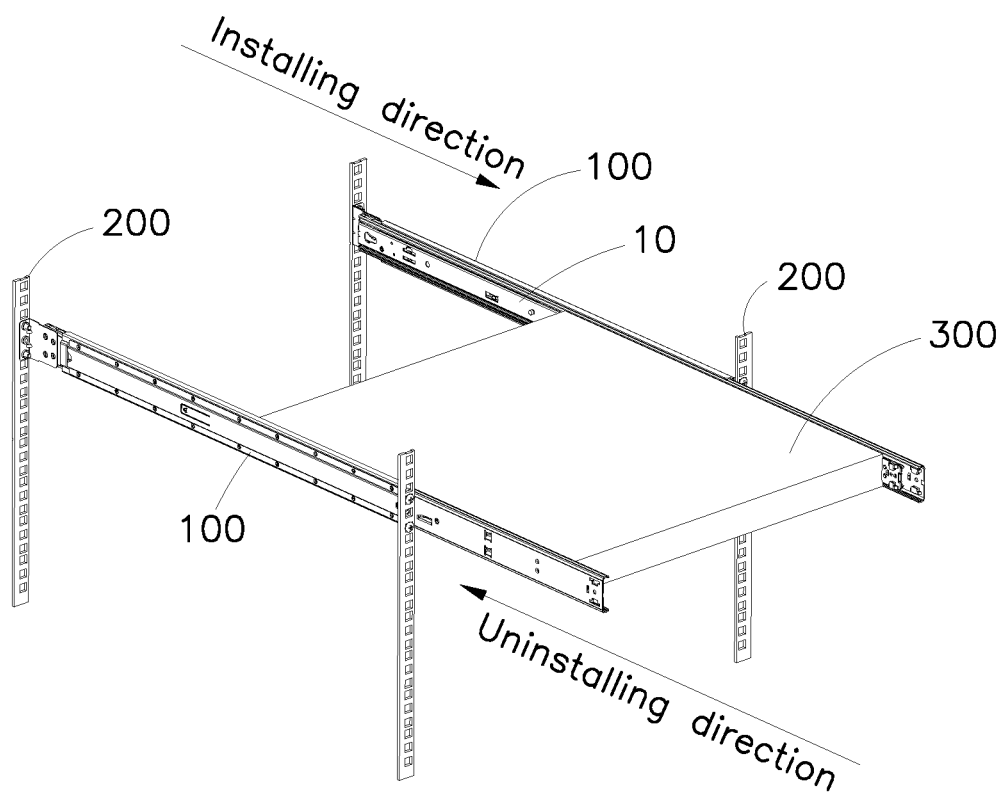
FIG. 1 illustrates an isometric view of an exemplary embodiment of a mounting apparatus.
Figure 2:
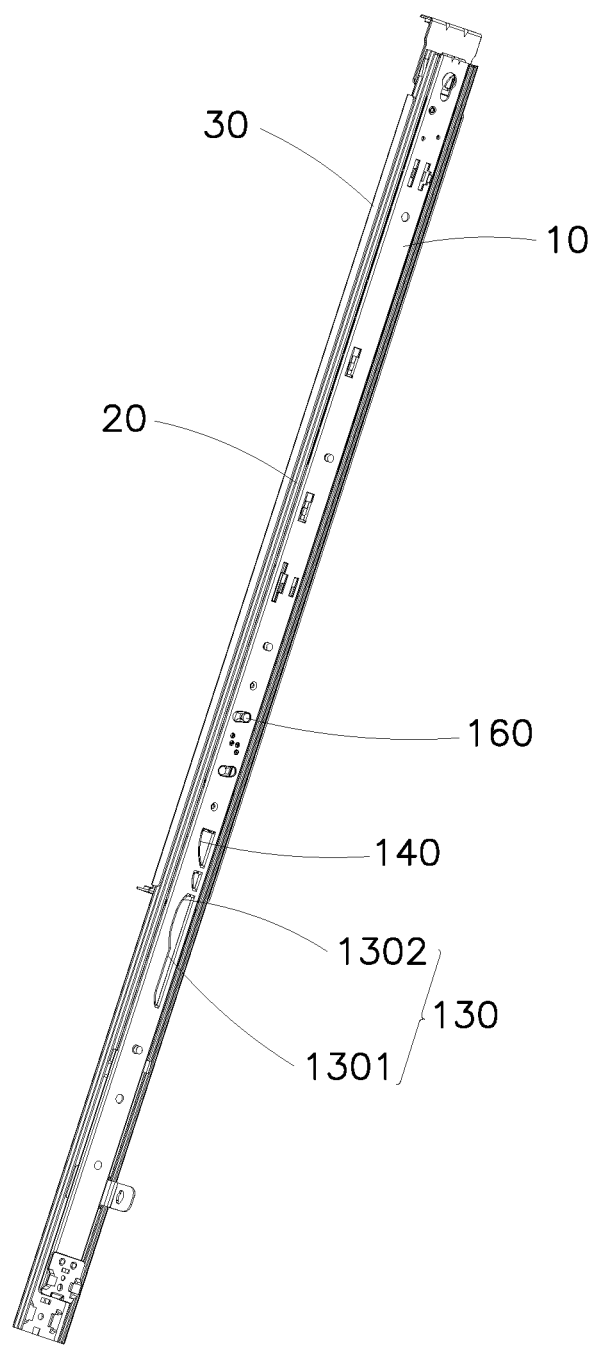
FIG. 2 illustrates an isometric view of a sliding mechanism of the mounting apparatus of FIG. 1.
Figure 3:
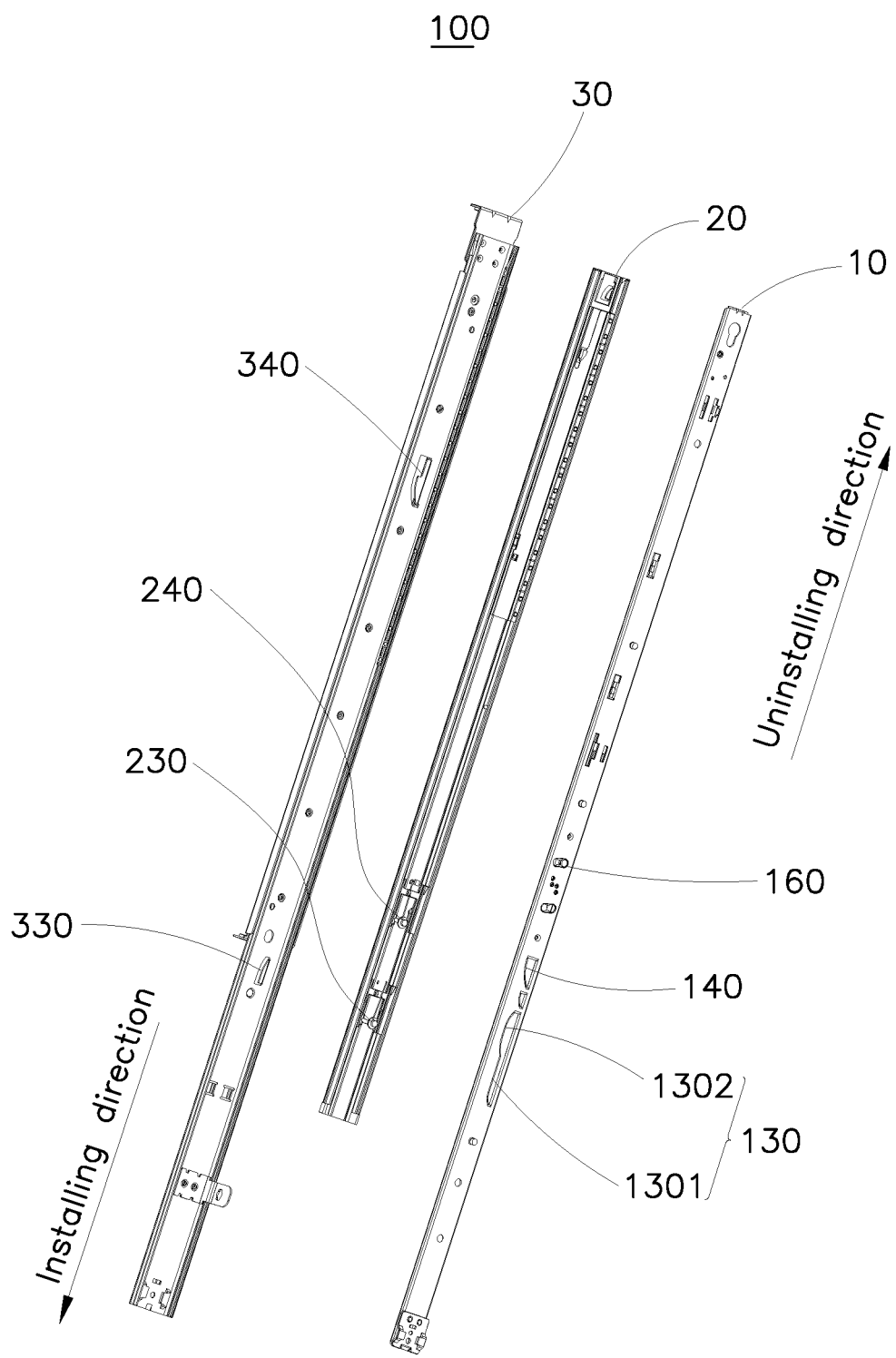
FIG. 3 illustrates an exploded view of the sliding mechanism of FIG. 2.
Figure 4:
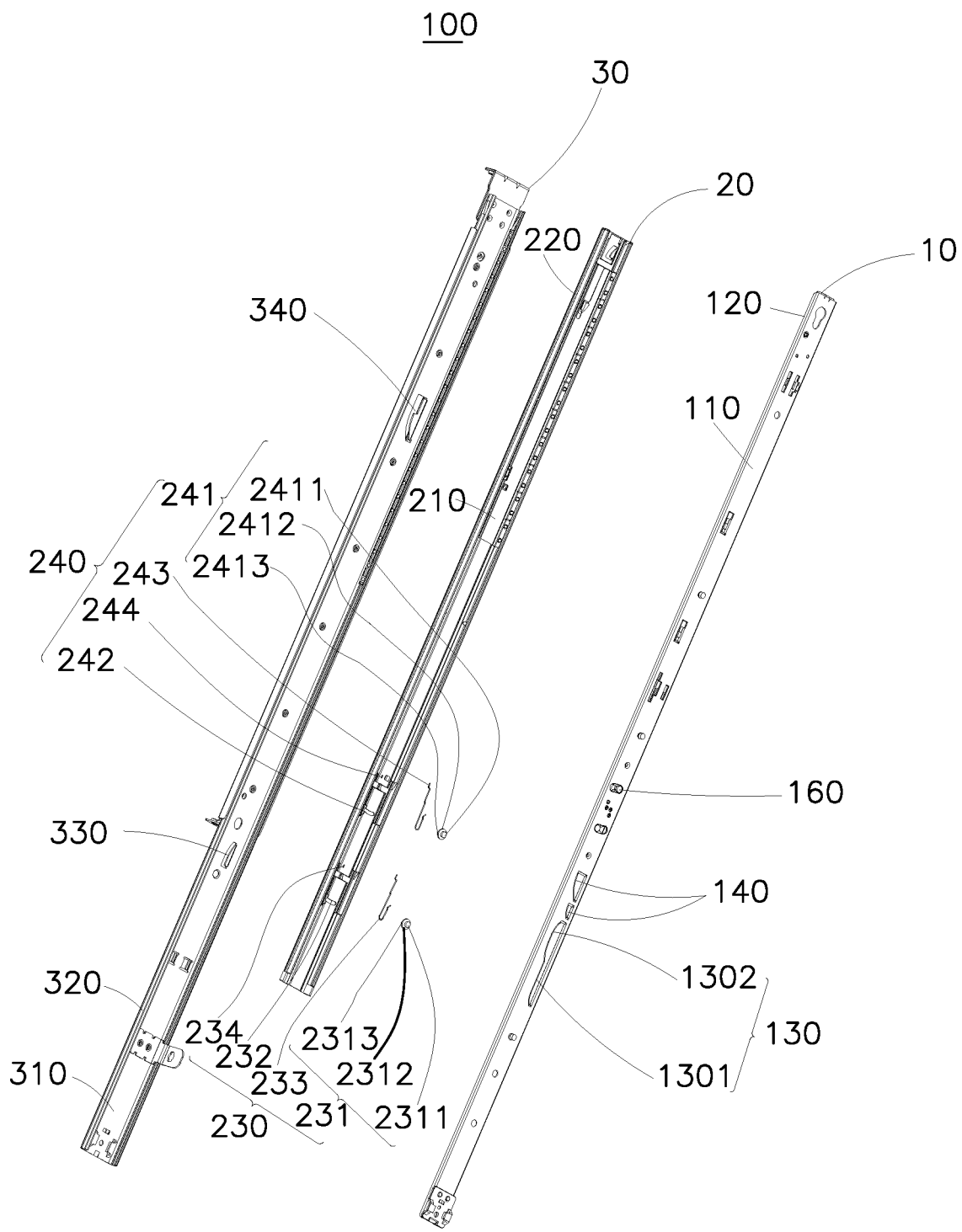
FIG. 4 illustrates another exploded view of the sliding mechanism of FIG. 2.
Figure 5:
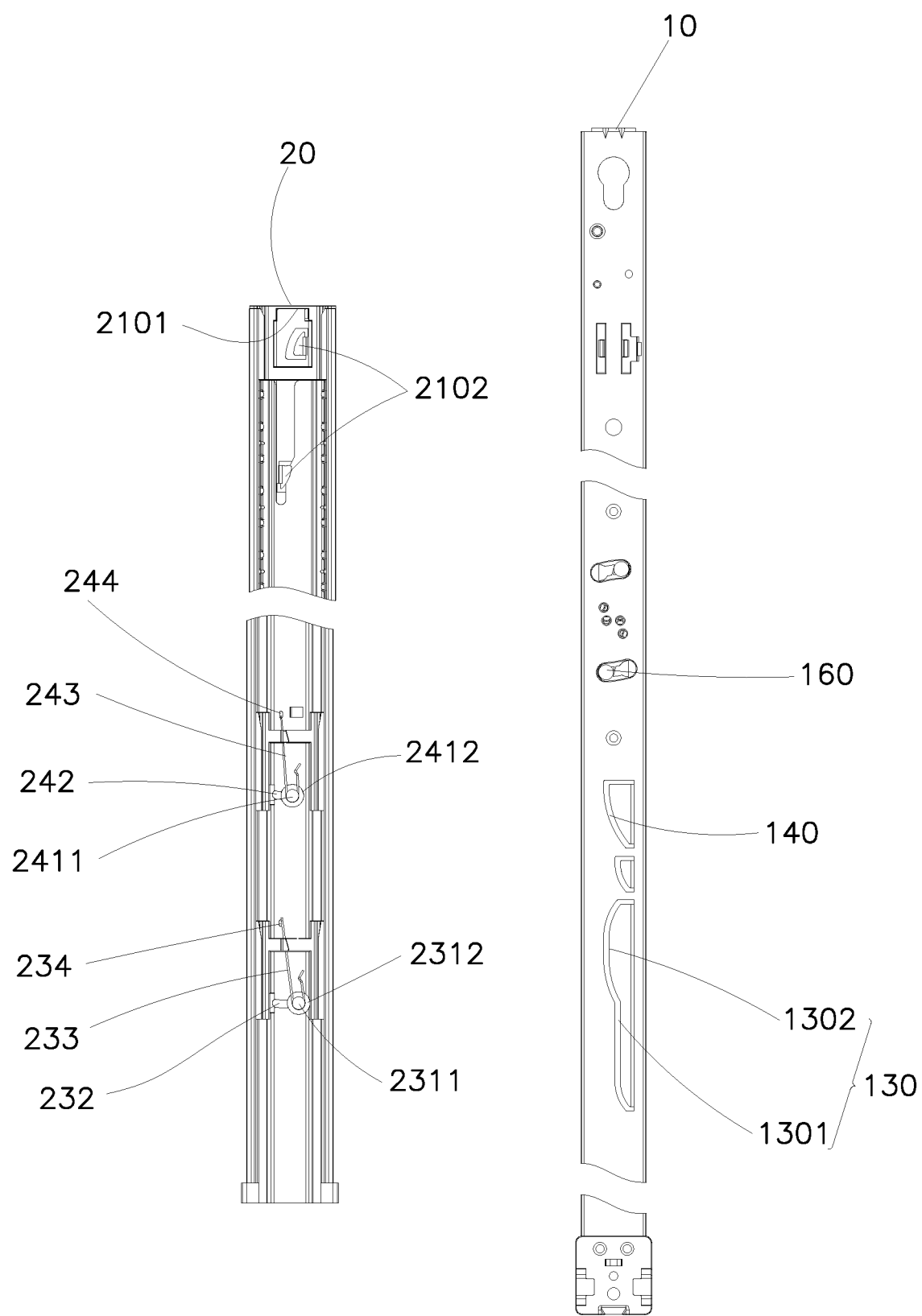
FIG. 5 illustrates an exploded view of the inner rail and middle rail of the sliding mechanism of FIG. 2.
Figure 6:
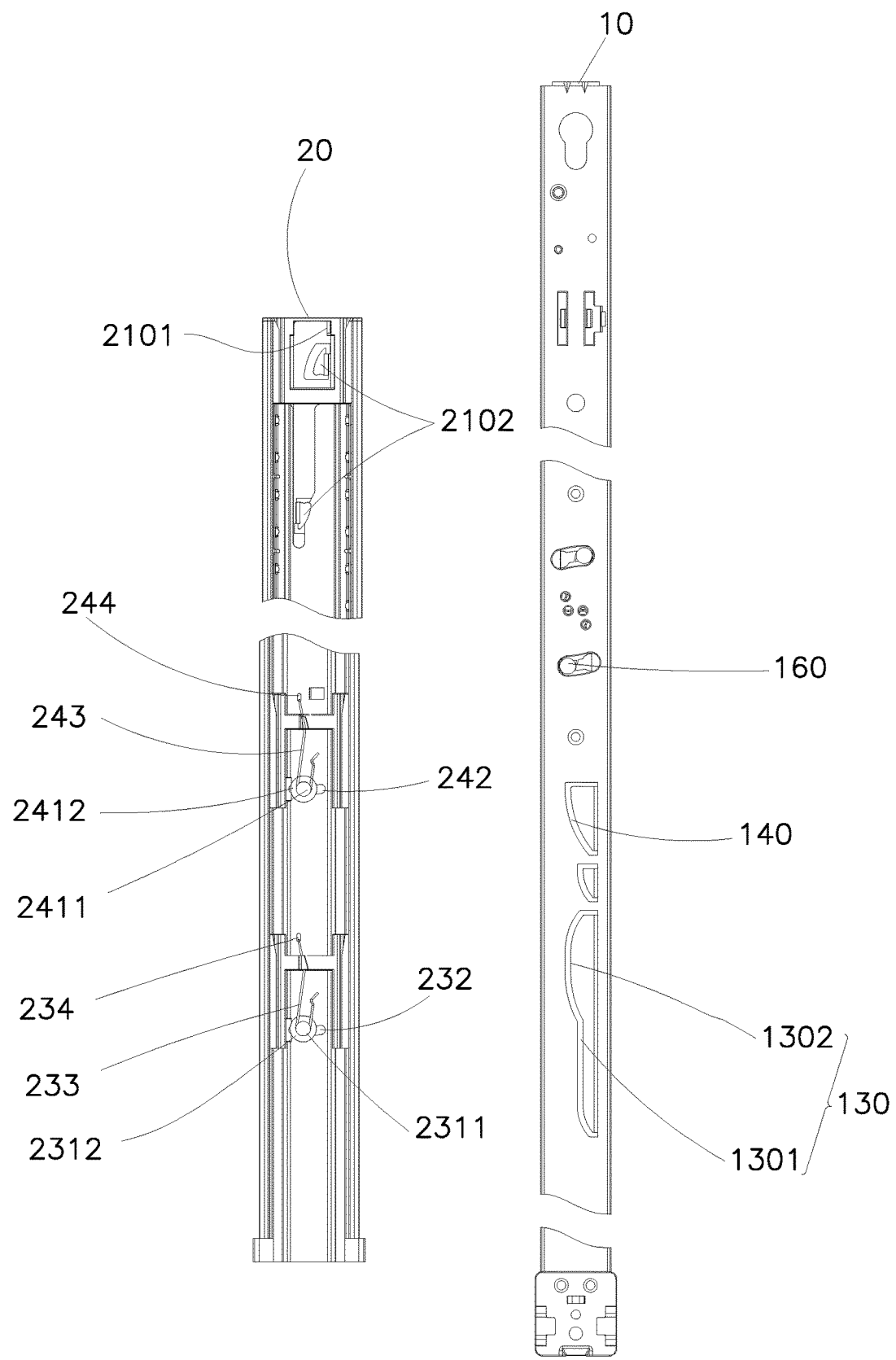
FIG. 6 illustrates another exploded view of the inner rail and middle rail of the sliding mechanism of FIG. 2.
Figure 7:
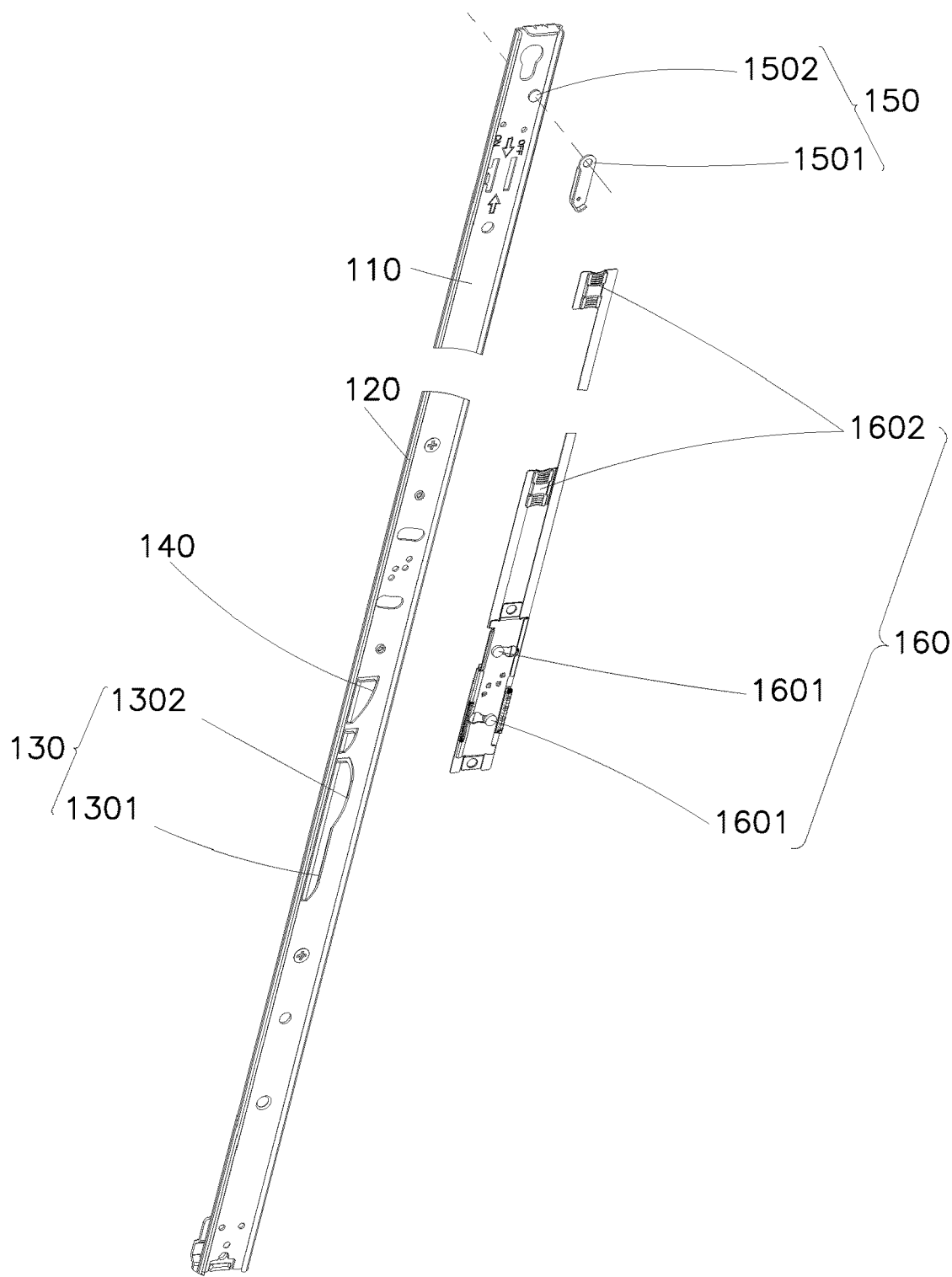
FIG. 7 illustrates an exploded view of the inner rail of the sliding mechanism of FIG. 2.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIG. 1 illustrates a mounting apparatus 500.

The mounting apparatus 500 can include a supporting bracket 200 and a sliding mechanism 100. The sliding mechanism 100 can be installed on the supporting bracket 200.

The mounting apparatus 500 can be used to mount an inserting unit 300. For example, the inserting unit 300 can be a storage unit, such as a hard disk drive. The mounting apparatus 500 can include four supporting brackets 200 and two sliding mechanisms 100. Each sliding mechanism 100 is supported by two supporting brackets 200. The two sliding mechanisms 100 are parallel with each other and adjacent to each other.

Opposite sides of the inserting unit 300 are mounted to the sliding mechanisms 100.

Referring also to FIGS. 2-7, the sliding mechanism 100 can include an outer rail 30, a middle rail 20, an inner rail 10, a latching unit (not labeled) and a locking unit 150.

The middle rail 20 is slidably mounted to the outer rail 30, and the inner rail 10 is slidably mounted to the middle rail 20. The middle rail 20 is between the outer rail 30 and the inner rail 10.

For example, in at least one exemplary embodiment, the inner rail 10 can include a first main body 110 and two first guiding flanges 120 defined on opposite sides of the first main body 110. The first guiding flanges 120 extend along an extending direction of the first main body 110.

Similarly, the middle rail 20 can include a second main body 210 and second guiding flanges 220 defined on opposite sides of the second main body 210. The second guiding flanges 220 extend along an extending direction of the second main body 210.

The outer rail 30 can include a third main body 310 and third guiding flanges 320 defined on opposite sides of the third main body 310. The third guiding flanges 320 extend along an extending direction of the third main body 310.

Each first guiding flange 120 can be slidably connected to a second guiding flange 220, and the inner rail 10 can be slidably mounted to the middle rail 20 through the first guiding flanges 120 and the second guiding flanges 220.

Similarly, each of the second guiding flanges 220 can be slidably connected to a third guiding flange 320, the middle rail 20 can be slidably mounted to the outer rail 30 through the second guiding flanges 220 and the third guiding flanges 320.

The sliding mechanism 100 can be installed on the supporting bracket 200 by the outer rail 30, and opposite sides of the inserting unit 300 can be mounted to the inner rails 10 of the sliding mechanisms 100.

The latching unit can include a first guiding portion 130, a second guiding portion 140, a first positioning member 230, a second positioning member 240, a third guiding portion 330, and a fourth guiding portion 340.

The first guiding portion 130 and the second guiding portion 140 can be defined on the inner rail 10.

The first positioning member 230 and the second positioning member 240 can be slidably mounted to the middle rail 20.

The third guiding portion 330 and the fourth guiding portion 340 can be defined on the outer rail 30.

The locking unit 150 can include a locking member 1501 and a locking portion 2101.

The locking member 1501 is rotatably mounted to an end of the inner rail 10.

The locking portion 2101 is defined on the middle rail 20 and the locking portion 2101 corresponds to the locking member 1501.

The locking member 1501 is rotatable between an unlocking position and a locking position.

For example, the first main body 110 of the inner rail defines a rotating portion 1502 corresponding to the locking member 1501, and the locking member 1501 is rotatably mounted to the rotating portion 1502.

The locking member 1501 can be rotated one way to lock with the locking portion 2101 or be rotated another way to unlock from the locking portion 2101.

When the locking member 1501 is rotated to the unlocking position, the locking member 1501 unlocks the locking portion 2101.

The inner rail 10 can slide along an installing direction until the first guiding portion 130 is resisted by the first positioning member 230 and the second guiding portion 140 is resisted by the second positioning member 240. In this situation, the first positioning member 230 is latched by the third guiding member 330 and the middle rail 20 is prevented from sliding relative to the outer rail 30.

When the inner rail 10 slides along an uninstalling direction (opposite to the installing direction), the second positioning member 240 is latched by the second guiding member 140 and the inner rail 10 is prevented from sliding relative to the middle rail 20. The inner rail 10 drives the middle rail 20 to slide relative to the outer rail 30 until the second positioning member 240 is resisted by the fourth guiding portion 340, the fourth guiding portion 340 drives the second positioning member 240 to be released by the second guiding portion 140, and the inner rail 10 is released to slide and be uninstalled from the middle rail 20 and the outer rail 30.

When the locking member 1501 is rotated to the locking position, the locking member 1501 locks the locking portion 2101.

When the inner rail 10 slides along the installing direction, the inner rail 10 drives the middle rail 20 to slide together until the first positioning member 230 is latched by the third guiding member 330 and the middle rail 20 is prevented from sliding relative to the outer rail 30. When the inner rail 10 slides along the uninstalling direction, the middle rail 20 is prevented from sliding relative to the outer rail 30, and the inner rail 10 slides to be uninstalled from the middle rail 20 and the outer rail 30.

In at least one exemplary embodiment, the sliding mechanism 100 can further include a stopping unit 160.

The stopping unit 160 can include a stopping member 1601, an operating member 1602, and a stopping portion 2102.

The stopping member 1601 is slidably mounted to a middle portion of the inner rail 10.

The operating member 1602 is connected to the stopping member 1601.

The stopping portion 2102 is defined on the middle rail 20.

The stopping member 1601 is slidable between a locking position and an unlocking position. When the stopping member 1601 is slid to the locking position, the stopping member 1601 locks the stopping portion 2102. When the stopping member 1601 is slid to the unlocking position, the locking member 1601, driven by the operating member 1602, unlocks the stopping portion 2102.

The first guiding portion 130 can include a linear guiding portion 1301 and a first arc guiding portion 1302. An end of the first arc guiding portion 1302 is connected to the linear guiding portion 1301.

The second guiding portion 140 includes a second arc guiding portion (not labeled).

The third guiding portion 330 can include a third arc guiding portion (not labeled), and the fourth guiding portion 340 can be a fourth arc guiding portion.

The first positioning member 230 can include a first mounting portion 234, a first positioning slot 232, a first positioning pillar 231, and a first elastic part 233.

The first mounting portion 234 is defined on the middle rail 20.

The first positioning slot 232 is defined in the middle rail 20 and the first positioning slot 232 extends perpendicular to the extending direction of the middle rail 20.

The first positioning pillar 231 can include a first cylinder 2312, a first positioning end 2311, and a second positioning end 2313.

The first positioning end 2311 and the second positioning end 2313 are fixed to opposing ends of the first cylinder 2312.

The first elastic part 233 includes opposing ends. One of the two opposing ends is connected to the first positioning pillar 231, the other one of the two opposing ends is connected to the first mounting portion 234.

For example, the first elastic part 233 can be a hook spring. An end of the hook spring is connected to the first positioning pillar 231, the other end of the hook spring is connected to the first mounting portion 234.

The first positioning end is 2311 is slidable along the linear guiding portion 1301 and the first arc guiding portion 1302. The second positioning end 2313 passes through the first positioning slot 232 and is slidable along the third arc guiding portion.

The second positioning member 240 can include a second mounting portion 244, a second positioning slot 242, a second positioning pillar 241, and a second elastic member 243.

The second mounting portion 244 is defined on the middle rail 20.

The second positioning slot 242 is defined in the middle rail 20 and extends perpendicular to the extending direction of the middle rail 20.

The second positioning pillar 241 can include a second cylinder 2412, a third positioning end 2411, and a fourth positioning end 2413.

The third positioning end 2411 and the fourth positioning end 2413 are fixed to opposing ends of the second cylinder 2412.

The second elastic part 243 includes opposing ends, one of the two opposing ends is connected to the second positioning pillar 241, the other one of the two opposing ends is connected to the second mounting portion 244.

The third positioning end 2411 is slidable along the linear guiding portion 1301 and either the first arc guiding portion 1302 or the second arc guiding portion. The fourth positioning end 2413 passes through the second positioning slot 242 and is slidable along the fourth arc guiding portion.

An end of the third arc guiding portion defines a holding portion. When the first positioning member 230 is moved to the third arc guiding portion, the second positioning end 2313 is resisted by the holding portion and the middle rail 20 is prevented from sliding relative to the outer rail 30.

The first mounting portion 234 and the second mounting portion 244 can be mounting holes defined on middle rail 20.

The linear guiding portion 1301, the first arc guiding portion 1302, and the second arc guiding portion can be flanges defined on a side surface of the inner rail 10. The third arc guiding portion and the fourth arc guiding portion can be flanges defined on a side surface of the outer rail 30.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A sliding mechanism comprising:
   an outer rail;
   a middle rail slidably mounted to the outer rail;
   an inner rail slidably mounted to the middle rail;
   a latching unit comprising:
     a first guiding portion defined on the inner rail;
     a second guiding portion defined on the inner rail;
     a first positioning member slidably mounted to the middle rail;
     a second positioning member slidably mounted to the middle rail;
     a third guiding portion defined on the outer rail; and
     a fourth guiding portion defined on the outer rail; and
   a locking unit comprising:
     a locking member rotatably mounted to an end of the inner rail; and
     a locking portion defined on the middle rail and corresponding to the locking member;
   wherein
   when the locking member is rotated to an unlocking position, where the locking member unlocks the locking portion, and when the inner rail slides along an installing direction until the first guiding portion is resisted by the first positioning member and the second guiding portion is resisted by the second positioning member, the first positioning member is latched by the third guiding portion and the middle rail is prevented from sliding relative to the outer rail; and
   wherein when the locking member is rotated to the unlocking position, where the locking member unlocks the locking portion, and when the inner rail slides along an uninstalling direction opposite to the installing direction, the second positioning member is latched by the second guiding portion, the inner rail is prevented from sliding relative to the middle rail, and the inner rail drives the middle rail to slide relative to the outer rail until the second positioning member is resisted by the fourth guiding portion, at which point the fourth guiding portion drives the second positioning member to be released by the second guiding portion, and the inner rail is released to slide and uninstalled from the middle rail and the outer rail;
   when the locking member is rotated to a locking position, where the locking member locks the locking portion, and when the inner rail slides along the installing direction, the inner rail drives the middle rail to slide together until the first positioning member is latched by the third guiding portion and the middle rail is prevented from sliding relative to the outer rail; and
   when the locking member is rotated to the locking position, where the locking member locks the locking portion, and when the inner rail slides along the uninstalling direction, the middle rail is prevented from sliding relative to the outer rail, the inner rail slides to be uninstalled from the middle rail and the outer rail.

2. The sliding mechanism of claim 1, wherein the sliding mechanism further comprises a stopping unit comprising:
   a stopping member slidably mounted to a middle portion of the inner rail;
   an operating member connected to the stopping member; and
   a stopping portion defined on the middle rail;
   wherein the stopping member is slidable between a locking position, where the stopping member locks the stopping portion, and an unlocking position, where the locking member unlocks the stopping portion by being driven by the operating member.

3. The sliding mechanism of claim 1, wherein the first guiding portion comprises:
   a linear guiding portion; and
   a first arc guiding portion connected to the linear guiding portion;
   wherein the second guiding portion comprises a second arc guiding portion.

4. The sliding mechanism of claim 3, wherein the third guiding portion comprises a third arc guiding portion, and the fourth guiding portion comprises a fourth arc guiding portion.

5. The sliding mechanism of claim 4, wherein the first positioning member comprises:
   a first mounting portion defined on the middle rail;
   a first positioning slot defined in the middle rail and extends perpendicular to the extending direction of the middle rail;
   a first positioning pillar comprising:
     a first cylinder;
     a first positioning end; and
     a second positioning end;
     wherein the first positioning end and the second positioning end are respectfully fixed to two opposing ends of the first cylinder;
   a first elastic part comprising two opposing ends, wherein one of the two opposing ends is connected to the first positioning pillar, the other one of the two opposing ends is connected to the first mounting portion;
   wherein the first positioning end is slidable along the linear guiding portion and the first arc guiding portion; the second positioning end passes through the first positioning slot and is slidable along the third arc guiding portion.

6. The sliding mechanism of claim 5, wherein the second positioning member comprises:
   a second mounting portion defined on the middle rail;
   a second positioning slot defined in the middle rail and extends perpendicular to the extending direction of the middle rail;
   a second positioning pillar comprising:
     a second cylinder;
     a third positioning end; and
     a fourth positioning end;
   wherein the third positioning end and the fourth positioning end are respectfully fixed to two opposing ends of the second cylinder;
   a second elastic part comprising two opposing ends, wherein one of the two opposing ends is connected to the second positioning pillar, the other one of the two opposing ends is connected to the second mounting portion;
   wherein the third positioning end is slidable along the linear guiding portion and the first arc guiding portion or the second arc guiding portion; the fourth positioning end passes through the second positioning slot and is slidable along the fourth arc guiding portion.

7. The sliding mechanism of claim 6, wherein an end of the third arc guiding portion defines a holding portion; when the first positioning member is moved to the third arc guiding portion, the second positioning end is resisted by the holding portion and the middle rail is prevented from sliding relative to the outer rail.

8. The sliding mechanism of claim 6, wherein the first mounting portion and the second mounting portion are mounting holes defined on middle rail.

9. The sliding mechanism of claim 4, wherein the linear guiding portion, the first arc guiding portion and the second arc guiding portion are flanges defined on a side surface of the inner rail; the third arc guiding portion and the fourth arc guiding portion are flanges defined on a side surface of the outer rail.

10. The sliding mechanism of claim 1, wherein the inner rail comprises a first guiding flange extending along the extending direction of the inner rail, the middle rail comprises a second guiding flange extending along the extending direction of the middle rail, the first guiding flange is slidably connected to the second guiding flange.

11. A mounting apparatus comprising:
a supporting bracket; and
a sliding mechanism installed on the supporting bracket, comprising:
an outer rail;
a middle rail slidably mounted to the outer rail;
an inner rail slidably mounted to the middle rail;
a latching unit comprising:
a first guiding portion defined on the inner rail;
a second guiding portion defined on the inner rail;
a first positioning member slidably mounted to the middle rail;
a second positioning member slidably mounted to the middle rail;
a third guiding portion defined on the outer rail; and
a fourth guiding portion defined on the outer rail; and
a locking unit comprising:
a locking member rotatably mounted to an end of the inner rail; and
a locking portion defined on the middle rail and corresponding to the locking member;
wherein when the locking member is rotated to an unlocking position, where the locking member unlocks the locking portion, and when the inner rail slides along an installing direction until the first guiding portion is resisted by the first positioning member and the second guiding portion is resisted by the second positioning member, the first positioning member is latched by the third guiding portion and the middle rail is prevented from sliding relative to the outer rail; and
wherein when the locking member is rotated to the unlocking position, where the locking member unlocks the locking portion, and when the inner rail slides along an uninstalling direction opposite to the installing direction, the second positioning member is latched by the second guiding portion, the inner rail is prevented from sliding relative to the middle rail, and the inner rail drives the middle rail to slide relative to the outer rail until the second positioning member is resisted by the fourth guiding portion, at which point the fourth guiding portion drives the second positioning member to be released by the second guiding portion, and the inner rail is released to slide and uninstalled from the middle rail and the outer rail;
when the locking member is rotated to a locking position, where the locking member locks the locking portion, and when the inner rail slides along the installing direction, the inner rail drives the middle rail to slide together until the first positioning member is latched by the third guiding portion and the middle rail is prevented from sliding relative to the outer rail; and
when the locking member is rotated to the locking position, where the locking member locks the locking portion, and when the inner rail slides along the uninstalling direction, the middle rail is prevented from sliding relative to the outer rail, the inner rail slides to be uninstalled from the middle rail and the outer rail.

12. The mounting apparatus of claim 11, wherein the sliding mechanism further comprises a stopping unit comprising:
a stopping member slidably mounted to a middle portion of the inner rail;
an operating member connected to the stopping member; and
a stopping portion defined on the middle rail;
wherein the stopping member is slidable between a locking position, where the stopping member locks the stopping portion, and an unlocking position, where the locking member unlocks the stopping portion by being driven by the operating member.

13. The mounting apparatus of claim 11, wherein the first guiding portion comprises:
a linear guiding portion; and
a first arc guiding portion connected to the linear guiding portion;
wherein the second guiding portion comprises a second arc guiding portion.

14. The mounting apparatus of claim 13, wherein the third guiding portion comprises a third arc guiding portion, and the fourth guiding portion comprises a fourth arc guiding portion.

15. The mounting apparatus of claim 14, wherein the first positioning member comprises:
a first mounting portion defined on the middle rail;
a first positioning slot defined in the middle rail and extends perpendicular to the extending direction of the middle rail;
a first positioning pillar comprising:
a first cylinder;
a first positioning end; and
a second positioning end;
wherein the first positioning end and the second positioning end are respectfully fixed to two opposing ends of the first cylinder;
a first elastic part comprising two opposing ends, wherein one of the two opposing ends is connected to the first positioning pillar, the other one of the two opposing ends is connected to the first mounting portion;
wherein the first positioning end is slidable along the linear guiding portion and the first arc guiding portion; the second positioning end passes through the first positioning slot and is slidable along the third arc guiding portion.

16. The mounting apparatus of claim 15, wherein the second positioning member comprises:
a second mounting portion defined on the middle rail;
a second positioning slot defined in the middle rail and extends perpendicular to the extending direction of the middle rail;
a second positioning pillar comprising:
a second cylinder;
a third positioning end; and
a fourth positioning end;
wherein the third positioning end and the fourth positioning end are respectfully fixed to two opposing ends of the second cylinder;

a second elastic part comprising two opposing ends, wherein one of the two opposing ends is connected to the second positioning pillar, the other one of the two opposing ends is connected to the second mounting portion;

wherein the third positioning end is slidable along the linear guiding portion and the first arc guiding portion or the second arc guiding portion; the fourth positioning end passes through the second positioning slot and is slidable along the fourth arc guiding portion.

17. The mounting apparatus of claim 16, wherein an end of the third arc guiding portion defines a holding portion; when the first positioning member is moved to the third arc guiding portion, the second positioning end is resisted by the holding portion and the middle rail is prevented from sliding relative to the outer rail.

18. The mounting apparatus of claim 16, wherein the first mounting portion and the second mounting portion are mounting holes defined on middle rail.

19. The mounting apparatus of claim 14, wherein the linear guiding portion, the first arc guiding portion and the second arc guiding portion are flanges defined on a side surface of the inner rail; the third arc guiding portion and the fourth arc guiding portion are flanges defined on a side surface of the outer rail.

20. The mounting apparatus of claim 11, wherein the inner rail comprises a first guiding flange extending along the extending direction of the inner rail, the middle rail comprises a second guiding flange extending along the extending direction of the middle rail, the first guiding flange is slidably connected to the second guiding flange.

* * * * *